United States Patent
Park

(10) Patent No.: US 7,763,521 B2
(45) Date of Patent: Jul. 27, 2010

(54) METAL WIRING AND METHOD FOR FORMING THE SAME

(75) Inventor: Kyung Min Park, Namdong-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 358 days.

(21) Appl. No.: 11/847,116

(22) Filed: Aug. 29, 2007

(65) Prior Publication Data

US 2008/0054473 A1    Mar. 6, 2008

(30) Foreign Application Priority Data

Aug. 29, 2006    (KR) ............... 10-2006-0082088

(51) Int. Cl.
*H01L 21/76*    (2006.01)
*H01L 21/31*    (2006.01)

(52) U.S. Cl. ............ 438/400; 438/758

(58) Field of Classification Search .......... None
See application file for complete search history.

(56) References Cited

U.S. PATENT DOCUMENTS

| | | | |
|---|---|---|---|
| 6,297,554 B1 * | 10/2001 | Lin | 257/752 |
| 6,432,811 B1 * | 8/2002 | Wong | 438/619 |
| 6,486,059 B2 * | 11/2002 | Lee et al. | 438/637 |
| 6,489,230 B1 * | 12/2002 | Huang | 438/624 |
| 6,610,592 B1 | 8/2003 | Shue et al. | |
| 6,984,577 B1 * | 1/2006 | Zhao et al. | 438/619 |
| 6,984,581 B2 * | 1/2006 | Wong | 438/623 |
| 2004/0084761 A1 * | 5/2004 | Karthikeyan et al. | 257/700 |
| 2006/0214298 A1 * | 9/2006 | Huang et al. | 257/758 |

* cited by examiner

*Primary Examiner*—Scott B Geyer
(74) *Attorney, Agent, or Firm*—Saliwanchik, Lloyd & Saliwanchik

(57) ABSTRACT

A metal wiring and method for forming the same are provided. A first conductive layer is formed on a semiconductor substrate, and an insulating layer is formed on the first conductive layer. A via and a trench are formed in the insulating layer, and a second conductive layer is formed by burying metal in the via and the trench. The insulating layer also includes materials with a low dielectric constant filled in second vias.

10 Claims, 3 Drawing Sheets

METAL WIRING AND METHOD FOR FORMING THE SAME

CROSS-REFERENCE TO RELATED APPLICATION

The present application claims the benefit under 35 U.S.C. §119 of Korean Patent Application No. 10-2006-0082088, filed Aug. 29, 2006, which is hereby incorporated by reference in its entirety.

BACKGROUND

Copper is often used as interconnection material in integrated circuits. When forming a metal wiring of a semiconductor device, a thin film of copper (Cu) can improve the reliability of the semiconductor device as compared to using aluminum (Al). Copper has a higher melting point than aluminum and can improve the speed of signal transfer since it has a low specific resistance.

However, the etching characteristics of copper are very poor. Accordingly, a dual damascene process has been applied when using copper.

BRIEF SUMMARY

Embodiments of the present invention provide a metal wiring and a method for forming the same. The metal wiring has a low dielectric constant and excellent mechanical strength A method for forming a metal wiring according to an embodiment includes: forming a first conductive layer on a semiconductor substrate; forming an insulating layer on the first conductive layer; forming a via and a trench by selectively removing a portion of the insulating layer; forming a second conductive layer by burying metal in the via and the trench; forming a plurality of vias in the insulating material; and filling in the plurality of vias with materials that have a low dielectric constant.

A metal wiring according to an embodiment includes: a first conductive layer formed on a semiconductor substrate; an insulating layer formed on the first conductive layer; a second conductive layer formed in the insulating layer; and materials with a low dielectric constant in the insulating layer.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
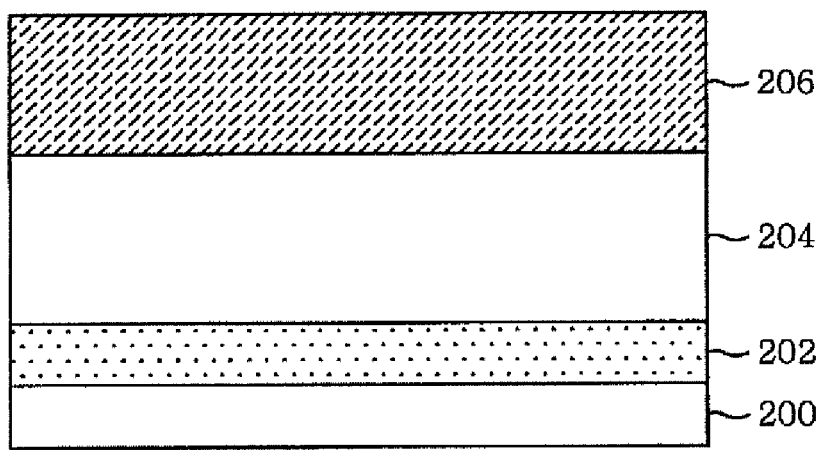
FIGS. 1 to 5 are cross-sectional views showing a method for forming a metal wiring according to an embodiment of the present invention.

Referring to FIG. 1, a first insulating layer 200 and a first conductive layer 202 can be formed on a semiconductor substrate (not shown). A second insulating layer 204 can be formed on the first conductive layer 202. A first photoresist 206 for a photo process can be applied on the second insulating layer 204. In an embodiment, the second insulating layer 204 is formed of fluoro-silicate glass (FSG). In an alternative embodiment, the second insulating layer 204 can be formed of carbon-doped silicon dioxide (e.g., Black Diamond). Carbon-doped silicon dioxide has a lower dielectric constant than FSG.

Figure 2:
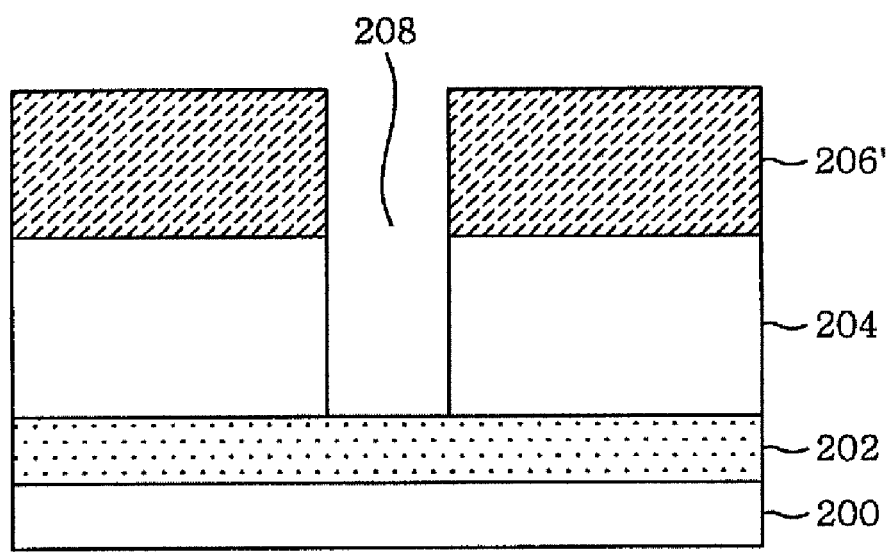

Referring to FIG. 2, a first photoresist pattern 206' can be formed by a photo process. Then, the second insulating layer 204 can be etched using the photoresist pattern 206' as a mask, thereby forming a first via region 208.

Figure 3:
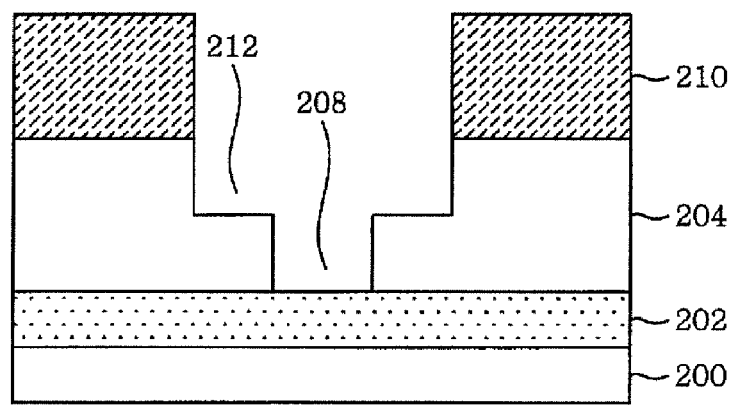

Referring to FIG. 3, after the first photoresist pattern 206' is removed, a second photoresist (not shown) can be applied to the upper surface of the substrate, and a photo process can be performed on the second photoresist, thereby forming a second photoresist pattern 210. Then, the second insulating layer 204 can be etched again using the second photoresist pattern 210 as a mask to form a trench wiring region 212.

Figure 4:
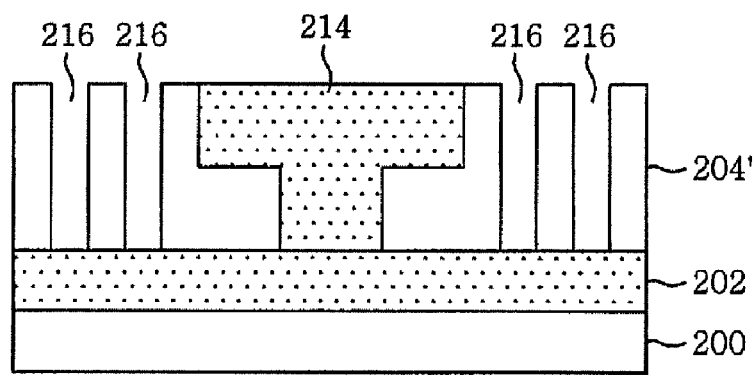

Referring to FIG. 4, the second photoresist pattern 210 patterned can be removed. Then, an electro chemical plating (ECP) process can be performed to form a second conductive layer 214 in the first via region 208 and the trench wiring region 212. In an embodiment, the second conductive layer can be copper. In a further embodiment, the second conductive layer can include a barrier metal.

The second insulating layer 204' can be etched again using the third photoresist pattern (not shown) as a mask to form second via regions 216.

Figure 5:
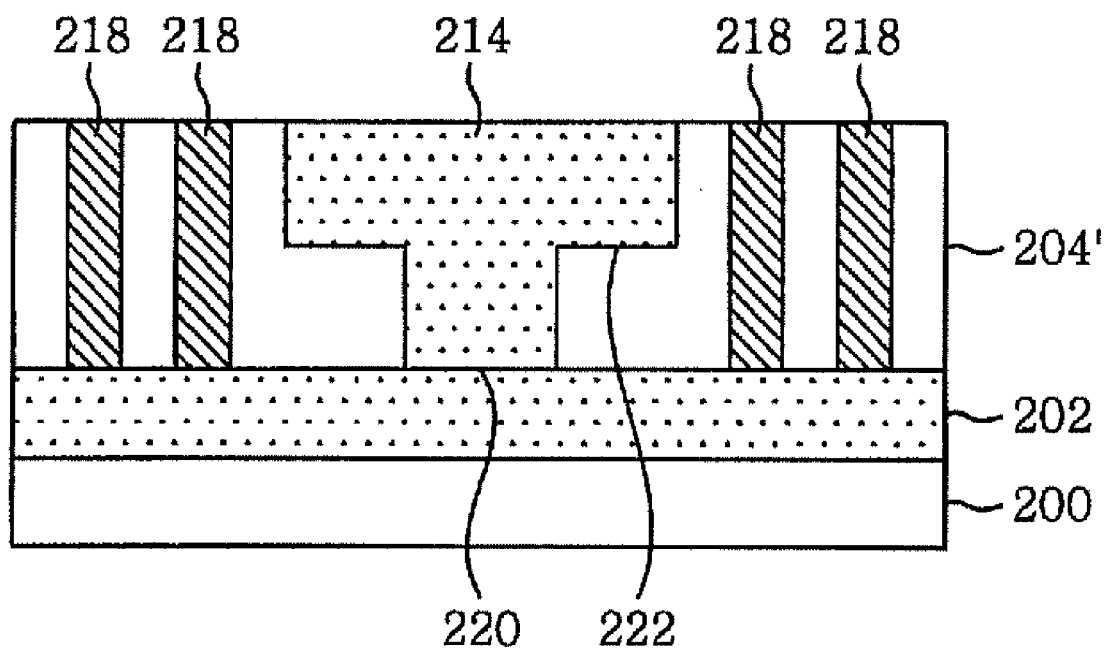

Referring to FIG. 5, a spin coating method or a high density plasma (HDP) deposition method can also be performed to form low-K dielectric materials 218 in a plurality of second via regions 216 in the second insulating layer 204'.

Materials with a low dielectric constant can be formed in the second via regions 216 of the second insulating layer 204'.

In many embodiments, the low-K dielectric materials 218 can be oxidation materials having excellent mechanical strength. In an embodiment, the low-K dielectric materials 218 can be carbon-doped silicon dioxide, which can have a lower dielectric constant than the second insulating layer 204.

In an embodiment, the carbon-doped silicon dioxide 218 can be filled into the second via regions 216 by a spin coating method. In an alternative embodiment, the carbon-doped silicon dioxide 218 can be filled into the second via regions 216 by a high density plasma (HDP) deposition method, In an embodiment, the dielectric constant of the carbon-doped silicon dioxide 218 used to fill the second via regions 216 is from about 2.6 to about 3.1.

In embodiments in which the second insulating layer is formed of FSG, the dielectric constant of the second insulating layer is from about 3.4 to about 3.8. Thus, using carbon-doped silicon dioxide 218 to fill in the second via regions helps make it possible to provide mechanical strength and maintain a low-K dielectric.

In embodiments in which the second insulating layer 204 is formed of carbon-doped silicon dioxide, the materials used to fill in the second via regions 216 can be FSG.

In an embodiment, FSG can fill in the second via regions by a spin coating method. In an alternative embodiment, FSG can fill in the second via regions by a HDP deposition method. In an embodiment, the dielectric constant of the FSG is from about 3.4 to about 3.8.

When formed of carbon-doped silicon dioxide, the dielectric constant of the second insulating layer is from about 2.6 to about 3.1. Thus, using FSG having a dielectric constant of from about 3.4 to about 3.8 to fill in the second via regions helps make it possible to provide mechanical strength, while maintaining the low-K dielectric.

The second conductive layer 214 can be present only in the first via region 208 and the trench wiring region 212 to form a via contacting part 220 and a wiring part 222.

Embodiments of the present invention allow for the formation of a via region on an insulating layer in a dual damascene pattern. The use of carbon-doped silicon dioxide or FSG provide excellent mechanical strength and a low dielectric constant within the via region. This maintains the low dielectric constant of porous materials while simultaneously securing mechanical strength.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a metal wiring, comprising:
   forming a first conductive layer on a semiconductor substrate;
   forming an insulating layer on the first conductive layer;
   forming a first via and a trench in the second insulating layer;
   forming a second conductive layer in the first via and the trench; and
   forming a plurality of second vias in the insulating layer adjacent to the first via and the trench; and
   filling each of the second vias with an oxidation material having a low-K dielectric,
   wherein the oxidation material having a low-K dielectric comprises a carbon-doped silicon dioxide.

2. The method according to claim 1, wherein the insulating layer comprises fluorosilicate glass.

3. The method according to claim 1, wherein the dielectric constant of the insulating layer is from about 3.4 to about 3.8, and wherein the dielectric constant of the oxidation material having a low-K dielectric is from about 2.6 to about 3.1.

4. The method according to claim 1, wherein filling each of the second vias with the oxidation material having the low-K dielectric comprises performing a spin coating method.

5. The method according to claim 1, wherein filling each of the second vias with the oxidation material having the low-K dielectric comprises performing a high density plasma deposition method.

6. The method according to claim 1, wherein forming the second conductive layer in the first via and the trench comprises performing an electro-chemical plating (ECP) process.

7. The method according to claim 1, wherein the metal comprises copper.

8. A method for forming a metal wiring, comprising:
   forming a first conductive layer on a semiconductor substrate;
   forming an insulating layer on the first conductive layer;
   forming a first via and a trench in the second insulating layer;
   forming a second conductive layer in the first via and the trench; and
   forming a plurality of second vias in the insulating layer adjacent to the first via and the trench; and
   filling each of the second vias with an oxidation material having a low-K dielectric.
   wherein the insulating layer comprises a carbon-doped silicon dioxide.
   wherein the oxidation material having a low-K dielectric comprises fluorosilicate glass.

9. The method according to claim 8, wherein the dielectric constant of the insulating layer is from about 2.6 to about 3.1, and wherein the dielectric constant of the oxidation material having a low-K dielectric is from about 3.4 to about 3.8.

10. The method according to claim 8, wherein filling each of the second vias with the oxidation material having a low-K dielectric comprises performing a high density plasma deposition method.

* * * * *